US006392497B1

(12) United States Patent
Takikawa

(10) Patent No.: US 6,392,497 B1
(45) Date of Patent: May 21, 2002

(54) PHASE-LOCKED LOOP CIRCUIT WITH HIGH LOCK SPEED AND STABILITY

(75) Inventor: Yutaka Takikawa, Hyogo (JP)

(73) Assignees: Mitsubishi Denki Kabushiki Kaisha, Tokyo; Mitsubishi Electric System LSI Design Corporation, Itami, both of (JP)

( * ) Notice: Subject to any disclaimer, the term of this patent is extended or adjusted under 35 U.S.C. 154(b) by 0 days.

(21) Appl. No.: 09/761,849

(22) Filed: Jan. 18, 2001

(30) Foreign Application Priority Data

Aug. 2, 2000 (JP) ........................................ 2000-234800

(51) Int. Cl.$^7$ ................................................ H03L 7/08
(52) U.S. Cl. ........................ 331/17; 331/175; 327/157; 327/156
(58) Field of Search .................... 331/17, 175; 327/156, 327/157

(56) References Cited

FOREIGN PATENT DOCUMENTS

| JP | 59-115623 | 7/1984 |
| JP | 62-30426 | 2/1987 |

*Primary Examiner*—Arnold Kinkead
(74) *Attorney, Agent, or Firm*—Burns, Doane, Swecker & Mathis, LLP

(57) ABSTRACT

A phase-locked loop circuit includes a voltage-controlled oscillator that includes a series circuit having a P-channel transistor, N-channel transistor, a third resistor and a first resistor connected in series in this order; a second resistor connected in parallel with a series circuit of the N-channel transistor and the third resistor; and an operational amplifier having its non-inverting input terminal connected to an output terminal of a lowpass filter, its inverting input terminal connected to a connected point of the third resistor and first resistor, and its output terminal connected to a gate of the N-channel transistor. The variable region of the resistance of the parallel circuit consisting of the N-channel transistor and the third and first resistors can be limited, which in turn enables the variable region of the control voltage of the voltage-controlled oscillator including a locking control voltage to be limited to a desired range. This makes it possible to limit the oscillation frequency of the voltage-controlled oscillator determined by the voltage signal fed from the lowpass filter to a desired range, and to increase its lock speed and stability at the same time.

3 Claims, 5 Drawing Sheets

PHASE-LOCKED LOOP CIRCUIT WITH HIGH LOCK SPEED AND STABILITY

BACKGROUND OF THE INVENTION

1. Field of the Invention

The present invention relates to a phase-locked loop circuit.

2. Description of Related Art

FIG. 7 is a block diagram showing a conventional phase-locked loop circuit. In this figure, the reference numeral 1 designates a phase comparator for outputting an error signal corresponding to a phase difference between a reference signal f and an output signal fn; 2 designates a charge pump for outputting a-voltage signal corresponding to the error signal; 3 designates a lowpass filter for passing a low frequency component of the voltage signal; 4 designates a voltage-controlled oscillator for outputting an oscillation frequency corresponding to the voltage signal passing through the lowpass filter 3; and 5 designates a frequency divider for supplying the phase comparator 1 with the output signal fn obtained by dividing the oscillation frequency fed from the voltage-controlled oscillator FIG. 8 is a circuit diagram showing a configuration of the conventional voltage-controlled oscillator 3. In this figure, the reference numeral 11 designates a controller for outputting a control voltage Vc corresponding to the voltage signal fed from the lowpass filter 3; and 12 designates a voltage-controlled oscillation circuit for outputting the oscillation frequency corresponding to the control voltage Vc.

In the controller 11, the reference numeral 13 designates a DC power supply; 14 designates a P-channel transistor; 15 designates an N-channel transistor; 16 designates a resistor; and 17 designates a ground, which are connected in series. The reference numeral 18 designates an operational amplifier having its non-inverting input terminal connected to the output terminal of the lowpass filter 3, its inverting input terminal to the connecting point between the N-channel transistor 15 and the resistor 16, and its output terminal connected to the gate of the N-channel transistor 15. The gate of the P-channel transistor 14 is connected to the connecting point between the P-channel transistor 14 and the N-channel transistor 15.

Next, the operation of the conventional phase-locked loop circuit will be described.

In FIG. 7, the phase comparator 1 outputs the error signal corresponding to the phase difference between the reference signal f and the output signal fn fed from the frequency divider 5. If the phase of output signal fn lags behind that of the reference signal f, the phase comparator 1 outputs the error signal Up, whereas if the phase of output signal fn leads that of the reference signal f, the phase comparator 1 outputs the error signal Down. The pulse width of each of the error signals Up and Down corresponds to the amount of the phase difference.

The charge pump 2 outputs the voltage signal corresponding to the error signal. The lowpass filter 3 passes only the low frequency component of the voltage signal with eliminating high frequency noise. The voltage-controlled oscillator 4 outputs the oscillation frequency corresponding to the voltage signal fed from the lowpass filter 3.

FIG. 8 shows the voltage-controlled oscillator 4 comprising the controller 11 for outputting the control voltage Vc corresponding to the voltage signal fed from the lowpass filter 3, and the voltage-controlled oscillation circuit 12 for outputting the oscillation frequency corresponding to the control voltage Vc.

The control voltage Vc for controlling the voltage-controlled oscillation circuit 12 is determined by a divided voltage produced by dividing the voltage across the DC power supply 13 to the ground 17 by the resistance RP1 of the P-channel transistor 14 and the resistance RN1 of the N-channel transistor plus the resistance R1 of the resistor 16. The resistance RN1 of the N-channel transistor 15 is varied in response to the potential of the voltage signal supplied from the lowpass filter 3 to the operational amplifier 18. Accordingly, the control voltage Vc varies in response to the potential of the voltage signal supplied from the lowpass filter 3 to the operational amplifier 18.

FIG. 9 is a graph illustrating relationships between the LPF potential (the potential of the output of the lowpass filter) and the oscillation frequency of the conventional voltage-controlled oscillator. In this figure, the oscillation frequency of the voltage-controlled oscillator 4 is locked on f1 when the potential of the voltage signal fed from the lowpass filter 3 is zero, on f2 when the potential of the voltage signal fed from the lowpass filter 3 and the control voltage Vc become equal to each other, and on the locked frequency f0 when the potential of the voltage signal fed from the lowpass filter 3 equals a locked potential V0. Thus, the oscillation frequency of the voltage-controlled oscillator 4 is variable between f1 and f2.

Returning to FIG. 7, the frequency divider 5 divides the oscillation frequency fed from the voltage-controlled oscillator 4, and supplies it to the phase comparator 1 as the output signal fn.

In a locked condition of such a phase-locked loop circuit, if part of the reference signal f supplied to the phase comparator 1 is lost for some reason, the phase comparator 1 makes a decision that the phase of the output signal fn leads that of the reference signal f, thereby outputting the error signal Down.

FIG. 10 is a diagram illustrating a waveform of the error signal Down output from the phase comparator 1 and that of the potential of the voltage signal passing through the lowpass filter 3. As illustrated in this figure, in response to the error signal Down fed from the phase comparator 1, the potential of the voltage signal passing through the lowpass filter 3 transiently drop from the locked potential V0 to Vd. Thus, while the potential of the voltage signal passing through the lowpass filter 3 is varying, the frequency of the output signal fn of the phase-locked loop circuit continues to change.

The characteristics of the phase-locked loop circuit is evaluated in terms of its lock speed and stability. The lock speed refers to the speed at which the phase-locked loop circuit enters the locked condition, and the stability refers to the degree of robustness of the locked condition against disturbance due to noise and the like. The lock speed increases with the amount of change in the potential of the voltage signal passing through the lowpass filter 3, or with the Δf/ΔV in the frequency characteristics of the voltage-controlled oscillator 4. On the other hand, the stability increases with the amount of change in the potential of the voltage signal passing through the lowpass filter 3, or with the Δf/ΔV in the frequency characteristics of the voltage-controlled oscillator 4. In other words, there is a tradeoff between the lock speed and the stability in terms of the amount of change in the potential of the voltage signal passing through the lowpass filter 3.

With the foregoing configuration, the conventional phase-locked loop circuit has a tradeoff between the lock speed and stability concerning the amount of change in the potential of the voltage signal passing through the lowpass filter 3, offering a problem of unable to improved the lock speed and stability at the same time.

SUMMARY OF THE INVENTION

The present invention is implemented to solve the foregoing problem. It is therefore an object of the present invention to provide a phase-locked loop circuit capable of improving its lock speed and stability at the same time.

According to one aspect of the present invention, there is provided a phase-locked loop circuit comprising: a phase comparator for outputting an error signal corresponding to a phase difference between a reference signal and an output signal; a charge pump for outputting a voltage signal corresponding to the error signal fed from the phase comparator; a lowpass filter for passing a low frequency component of the voltage signal fed from the charge pump; and a voltage-controlled oscillator including a series circuit having a first transistor, second transistor, a third resistor and a first resistor connected in series in this order, a second resistor connected in parallel with a series connection of the second transistor and the third resistor, and an operational amplifier having its non-inverting input terminal connected to an output terminal of the lowpass filter, its inverting input terminal connected to a connected point of the third resistor and the first resistor, and its output terminal connected to a gate of the second transistor.

Here, the voltage-controlled oscillator may produce the output signal with an oscillation frequency corresponding to a voltage at a connecting point of the first transistor with the second transistor whose resistance is varied by an output of the lowpass filter.

The second resistor and the third resistor may each comprise a plurality of resistors with different resistances, and switches for selecting any of the plurality of resistors.

DETAILED DESCRIPTION OF THE PREFERRED EMBODIMENTS

The invention will now be described with reference to the accompanying drawings.

EMBODIMENT 1

Figure 1:
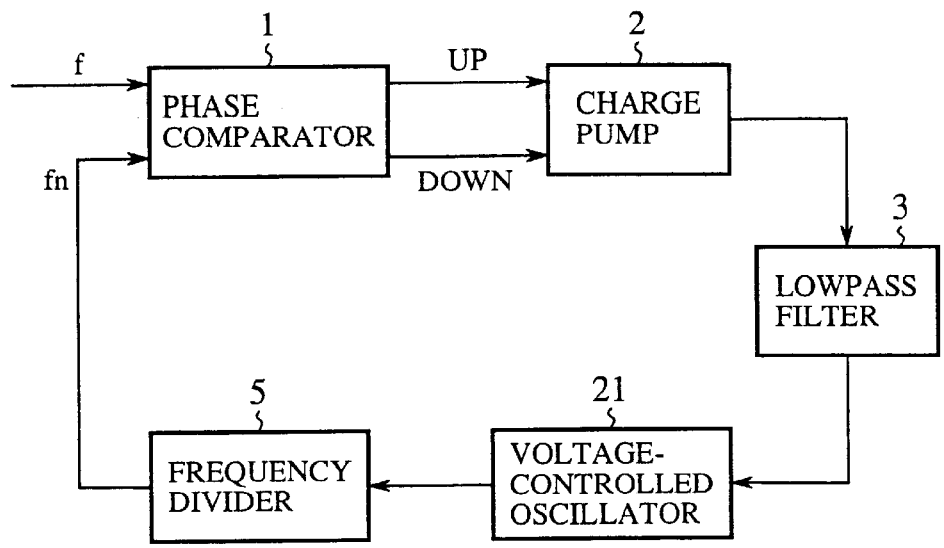
FIG. 1 is a block diagram showing a configuration of an embodiment 1 of the phase-locked loop circuit in accordance with the present invention.

FIG. 1 is a block diagram showing a configuration of an embodiment 1 of the phase-locked loop circuit in accordance with the present invention. In this figure, the reference numeral 1 designates a phase comparator for outputting an error signal corresponding to a phase difference between a reference signal f and an output signal fn; 2 designates a charge pump for outputting a voltage signal corresponding to the error signal; 3 designates a lowpass filter for passing a low frequency component of the voltage signal; 21 designates a voltage-controlled oscillator for outputting an oscillation frequency corresponding to the voltage signal passing through the lowpass filter 3; and 5 designates a frequency divider for supplying the phase comparator 1 with the output signal fn obtained by dividing the oscillation frequency fed from the voltage-controlled oscillator 21.

Figure 2:
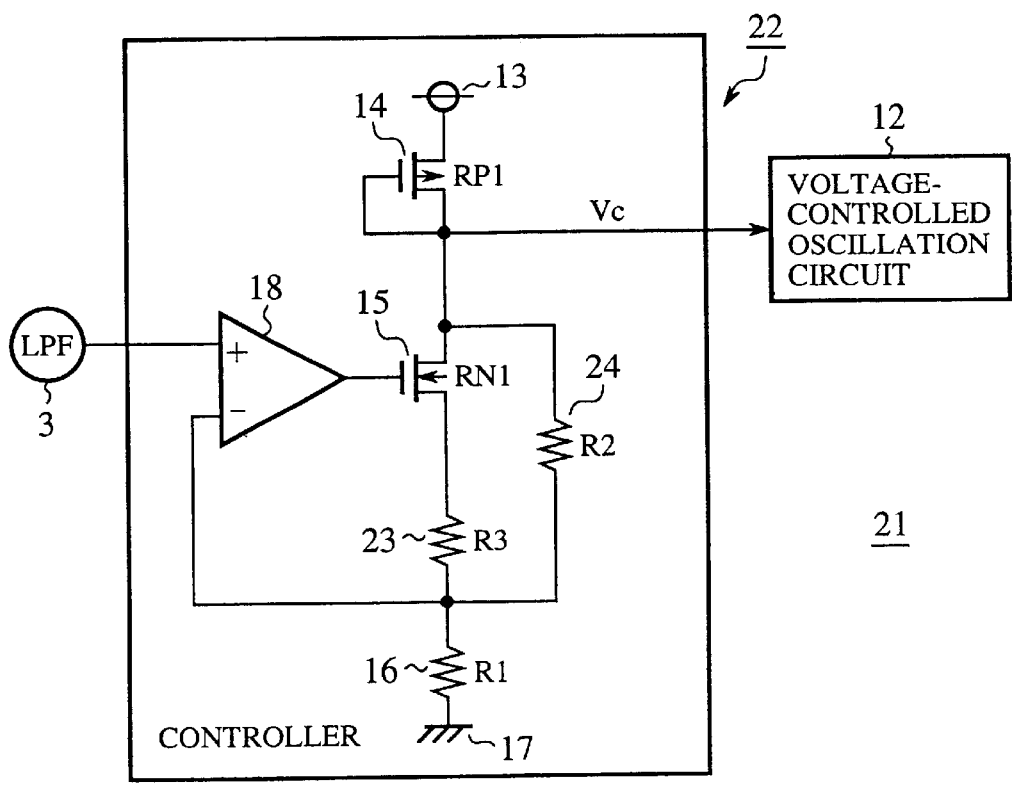
FIG. 2 is a circuit diagram showing a configuration of the voltage-controlled oscillator of the embodiment 1 of the phase-locked loop circuit in accordance with the present invention.

FIG. 2 is a circuit diagram showing a configuration of the voltage-controlled oscillator 21 of the present embodiment 1. In this figure, the reference numeral 22 designates a controller for outputting a control voltage Vc corresponding to the voltage signal fed from the lowpass filter 3; and 12 designates a voltage-controlled oscillation circuit for outputting the oscillation frequency corresponding to the control voltage Vc.

In the controller 22, the reference numeral 13 designates a DC power supply; 14 designates a P-channel transistor; 15 designates an N-channel transistor; 23 designates a resistor (third resistor); 16 designates a resistor (first resistor); and 17 designates a ground, which are connected in series in this order. The reference numeral 24 designates a resistor (second resistor) connected in parallel with the series connection of the N-channel transistor 15 and the resistor 23; and 18 designates an operational amplifier having its non-inverting input terminal connected to the output terminal of the lowpass filter 3, its inverting input terminal to the connecting point between the resistor 24 and the resistor 16, and its output terminal connected to the gate of the N-channel transistor 15. The gate of the P-channel transistor 14 is connected to the connecting point between the P-channel transistor 14 and the N-channel transistor 15.

Next, the operation of the present embodiment 1 of the phase-locked loop circuit will be described.

In FIG. 1, the phase comparator 1 outputs the error signal corresponding to the phase difference between the reference signal f and the output signal fn from the frequency divider 5. If the phase of the output signal fn lags behind that of the reference signal f, the phase comparator 1 outputs the error signal Up, whereas if the phase of output signal-fn leads that of the reference signal f, the phase comparator 1 outputs the error signal Down. The pulse width of each of the error signals Up and Down corresponds to the amount of the phase difference.

The charge pump 2 outputs the voltage signal corresponding to the error signal. The lowpass filter 3 passes only the low frequency component of the voltage signal with eliminating high frequency noise. The voltage-controlled oscillator 21 outputs the oscillation frequency corresponding to the voltage signal from the lowpass filter 3.

FIG. 2 shows the voltage-controlled oscillator 21 comprising the controller 11 for outputting the control voltage Vc corresponding to the voltage signal fed from the lowpass filter 3, and a voltage-controlled oscillation circuit 12 for outputting the oscillation frequency corresponding to the control voltage Vc.

The control voltage Vc for controlling the voltage-controlled oscillation circuit 12 is determined by a divided voltage produced by dividing the voltage across the DC power supply 13 to the ground 17 by the resistance RP1 of the P-channel transistor 14 and the parallel resistance, which is composed of the resistance RN1 of the N-channel transistor plus the resistance R3 of the resistor 23 and the resistance R2 of the resistor 24, plus the resistance R1 of the resistor 16. The resistance RN1 of the N-channel transistor 15 varies in response to the potential of the voltage signal supplied from the lowpass filter 3 to the operational amplifier 18. Accordingly, the control voltage Vc varies in response to the potential of the voltage signal supplied from the lowpass filter 3 to the operational amplifier 18. Since the resistance RN1 of the N-channel transistor 15 and the resistance R3 of the resistor 23 are connected in series, their combined resistance RN1' is nearly equal to RN1 when RN1>>R3 and to R3 when RN1<<R3, and is variable in the remaining conditions. In addition, since the combined resistance RN1' is connected in parallel with the resistance R2 of the resistor 24, their combined resistance R is nearly equal to R2 when RN1'>>R2 and RN1' when RN1'<<R2, and is variable in the remaining conditions.

Figure 3:
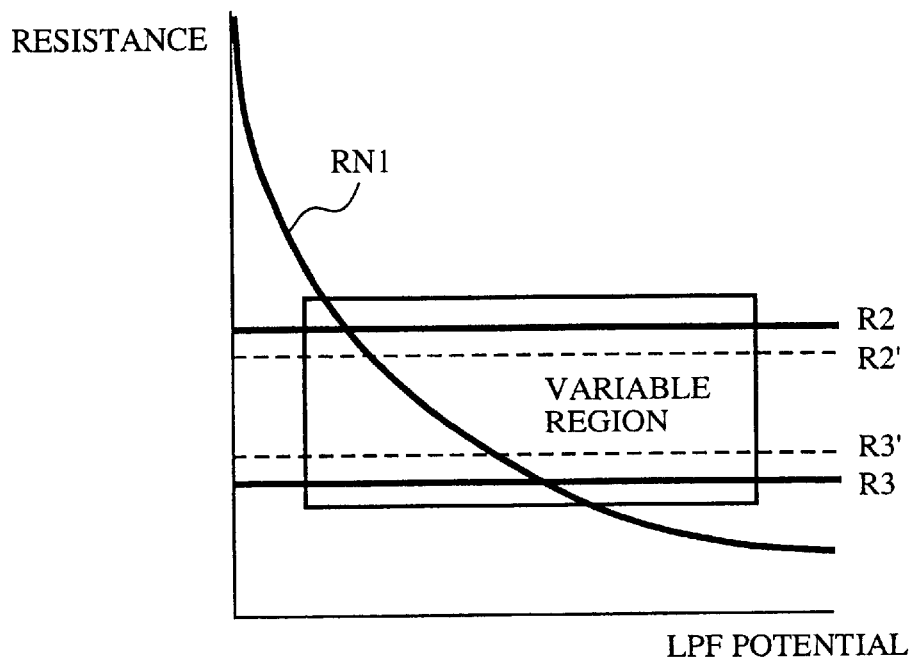
FIG. 3 is a graph illustrating relationships between a variable resistance RN1 and fixed resistances R2, R3, R2' and R3'.

FIG. 3 is a graph illustrating relationships between the resistance RN1 and the resistances R2 and R3. When there are such relationships as illustrated in FIG. 3 between the resistance RN1 of the N-channel transistor 15, and the resistance R3 of the resistor 23 and the resistance R2 of the resistor 24, the combined resistance R varies in the variable region. As for R2' and R3' in FIG. 3, they will be described later in connection with the embodiment 2.

Figure 4:
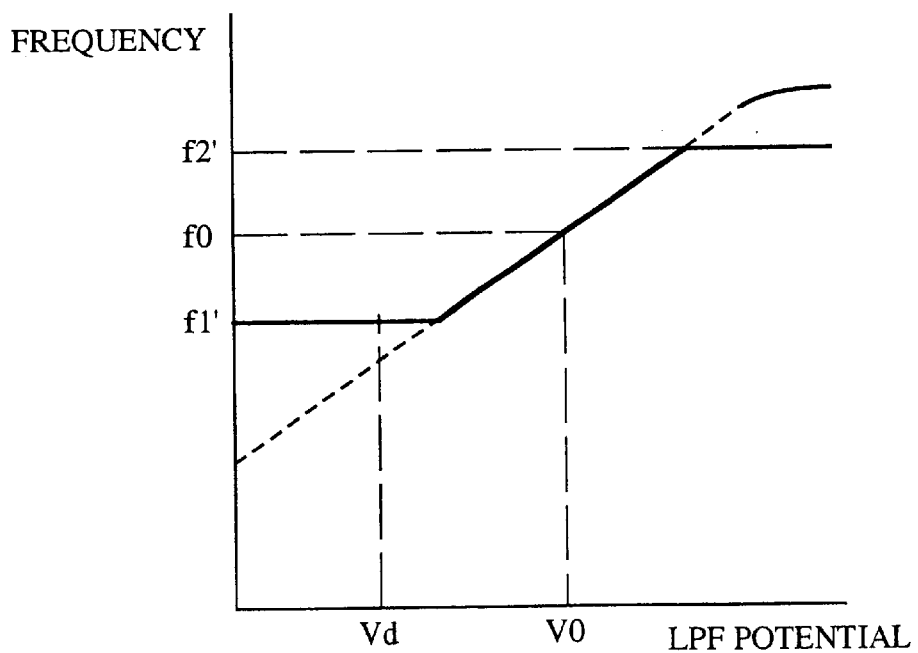
FIG. 4 is a graph illustrating relationships between the LPF potential and oscillation frequency of the voltage-controlled oscillator of the embodiment 1 of the phase-locked loop circuit in accordance with the present invention.

FIG. 4 is a graph illustrating relationships between the LPF potential and the oscillation frequency of the present embodiment 1 of the voltage-controlled oscillator. In this figure, as long as the potential of the voltage signal fed from the lowpass filter 3 is zero, the control voltage Vc is determined by the divided voltage generated by dividing the voltage across the DC power supply 13 to the ground 17 by the resistance RP1 of the P-channel transistor 14 and the resistance R2 of the resistor 24 plus the resistance R1 of the resistor 16, and hence does not change until the combined resistance R enters the variable region with an increase of the potential of the voltage signal fed from the lowpass filter 3. Thus, the oscillation frequency of the voltage-controlled oscillator 21 is fixed at f1'.

On the other hand, when the potential of the voltage signal fed from the lowpass filter 3 is high enough so that the combined resistance RN1' of the resistance RN1 of the N-channel transistor 15 and the resistance R3 of the resistor 23 becomes approximately equal to the resistance R3, the control voltage Vc is determined by the divided voltage produced by dividing the voltage across the DC power supply 13 to the ground 17 by the resistance RP1 of the P-channel transistor 14 and the parallel resistance of the resistance R3 of the resistor 23 and the resistance R2 of the resistor 24 plus the resistance R1 of the resistor 16, in which case, the control voltage Vc does not change because it exceeds the variable region of the combined resistance R. As a result, the oscillation frequency of the voltage-controlled oscillator 21 is fixed at f2'.

Thus, by suitably setting the resistances R2 and R3 of the resistors 23 and 24, the variable region of the control voltage Vc can be limited to a desired range including the control voltage V0 on which the voltage-controlled oscillator 21 is set at the locked condition. As a result, the oscillation frequency of the voltage-controlled oscillator 21 determined by the voltage signal fed from the lowpass filter 3 can be limited to a desired range, making it possible to increase the lock speed and stability of the phase-locked loop circuit at the same time.

Returning to FIG. 1, the frequency divider 5 divides the oscillation frequency fed from the voltage-controlled, oscillator 21, and supplies it to the phase comparator 1 as the output signal fn.

As described above, according to the present embodiment 1, the variable region of the resistance R of the parallel circuit consisting of the N-channel transistor 15, and resistors 23 and 24 can be limited by suitably setting the resistances R2 and R3 of the resistors 24 and 23. Therefore, the variable region of the control voltage Vc can be limited to the desired range including the control voltage V0 at which the voltage-controlled oscillator 21 is locked, by suitably setting the resistances R2 and R3 of the resistors 24 and 23. As a result, the oscillation frequency of the voltage-controlled oscillator 21 determined by the voltage signal fed from the lowpass filter 3 can be limited to a desired range, making it possible to increase the lock speed and stability of the phase-locked loop circuit at the same time.

EMBODIMENT 2

Figure 5:
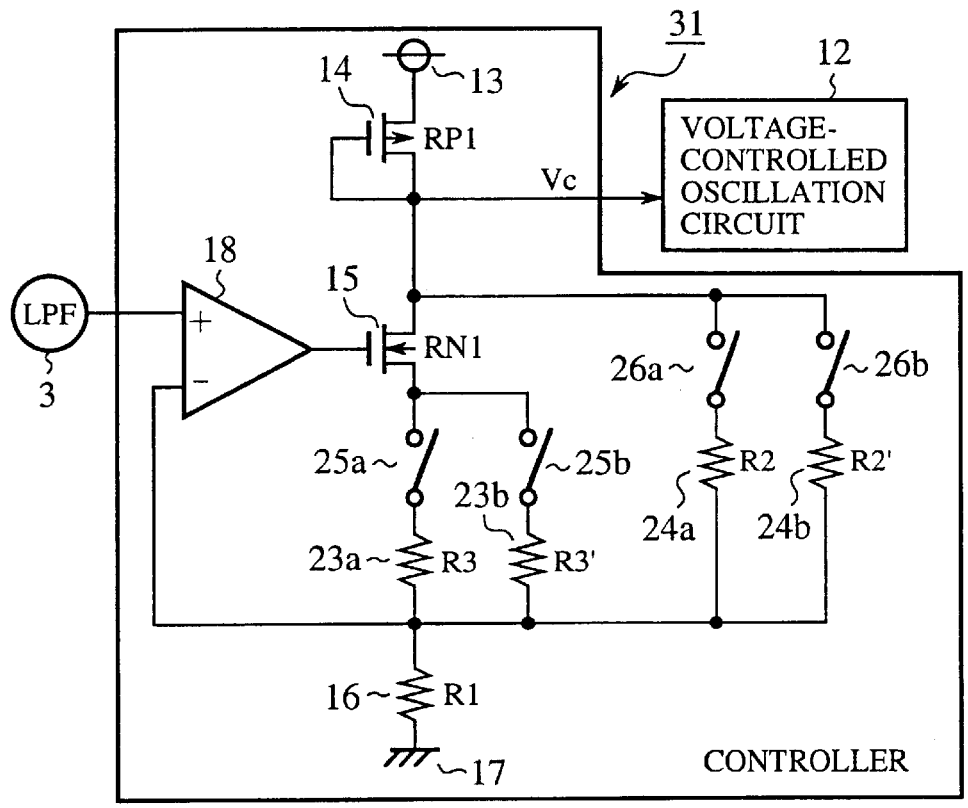
FIG. 5 is a circuit diagram showing a configuration of the voltage-controlled oscillator of an embodiment 2 of the phase-locked loop circuit in accordance with the present invention.

FIG. 5 is a circuit diagram showing an embodiment 2 of the voltage-controlled oscillator in accordance with the present invention. In this figure, reference numerals 23a and 23b designate resistors connected in parallel, the resistances of which are R3 and R3', respectively; 24a and 24b designate resistors connected in parallel, the resistances of which are R2 and R2', respectively; and 25a, 25b, 26a and 26b designate switches connected in series with the resistors 23a, 23b, 24a and 24b to select any of the resistors 23a, 23b, 24a and 24b. The remaining configuration is the same as that of FIG. 2.

Next, the operation of the present embodiment 2 will be described.

In FIG. 5, when the switches 25a and 25b are turned on while the switches 25b and 26b are kept off by software control, the control voltage Vc for controlling the voltage-controlled oscillation circuit 12 is determined by the divided voltage produced by dividing the voltage across the DC power supply 13 to the ground 17 by resistance RP1 of the P-channel transistor 14 and the parallel resistance consisting of the resistance RN1 of the N-channel transistor 15, the resistance R3 of the resistor 23a and the resistance R2 of the resistor 24a plus the resistance R1 of the resistor 16.

On the contrary, when the switches 25b and 26b are turned on while the switches 25a and 25b are kept off by the software control, the control voltage Vc for controlling the voltage-controlled oscillation circuit 12 is determined by the divided voltage produced by dividing the voltage across the DC power supply 13 to the ground 17 by resistance RP1 of the P-channel transistor 14 and the parallel resistance consisting of the resistance RN1 of the N-channel transistor 15, the resistance R3' of the resistor 23b and the resistance R2' of the resistor 24b plus the resistance R1 of the resistor 16.

FIG. 3 is a graph illustrating relationships between the resistances RN1, R2, R3, R2' and R3'. When there are relationships as illustrated in this figure between the resistance RN1 of the N-channel transistor 15, the resistance R3 of the resistor 23a, the resistance R2 of the resistor. 24a, the resistance R3' of the resistor 23b and the resistance R2 of the resistor 24a', the variable region of the combined resistance R is varied depending on the resistors connected by the switches, whether they are the resistors 23a and 24a or the resistors 23b and 24b.

Figure 6:
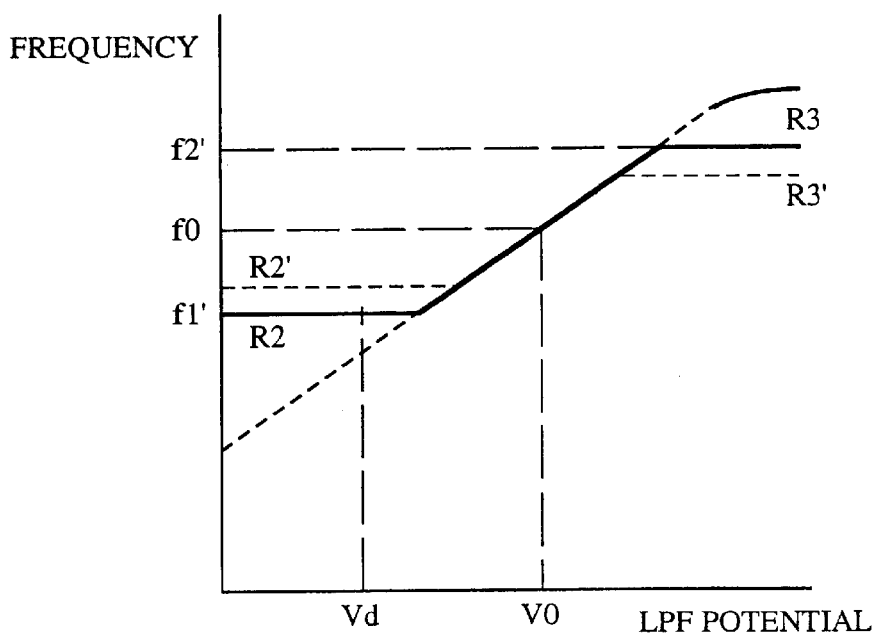
FIG. 6 is a graph illustrating relationships between the LPF potential and oscillation frequency of the voltage-controlled oscillator of the embodiment 2 of the phase-locked loop circuit in accordance with the present invention.
Figure 7:
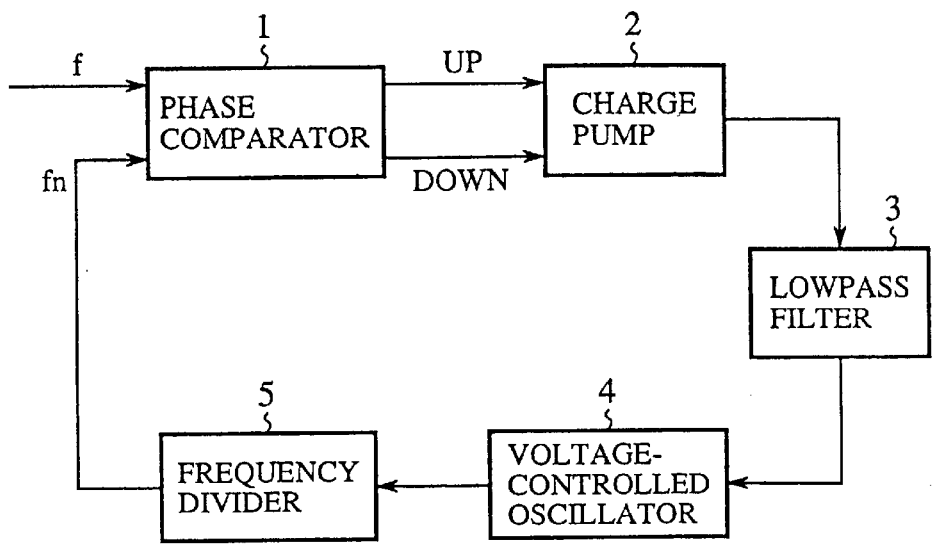
FIG. 7 is a block diagram showing a configuration of a conventional phase-locked loop circuit.
Figure 8:
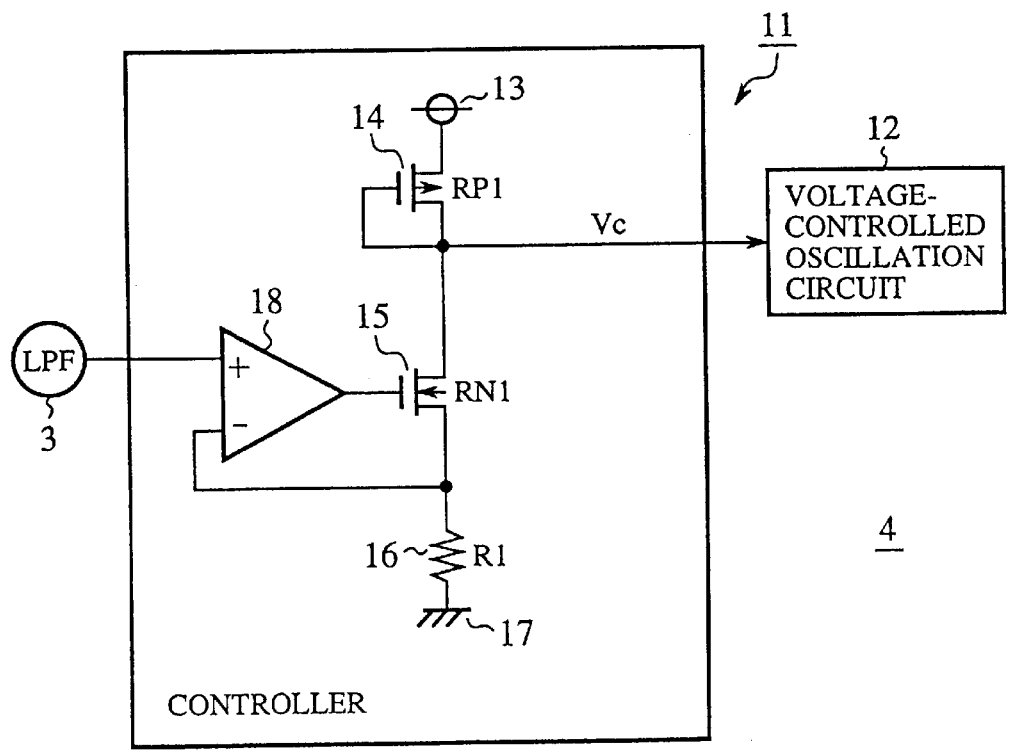
FIG. 8 is a circuit diagram showing a configuration of a conventional voltage-controlled oscillator.
Figure 9:
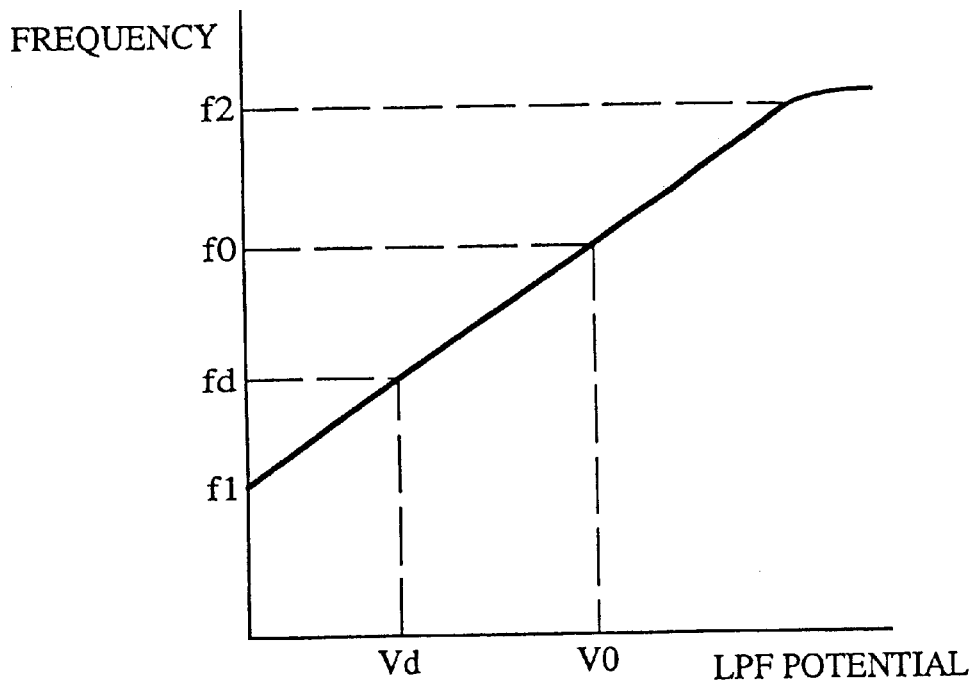
FIG. 9 is a graph illustrating relationships between the LPF potential and oscillation frequency of the conventional voltage-controlled oscillator.
Figure 10:
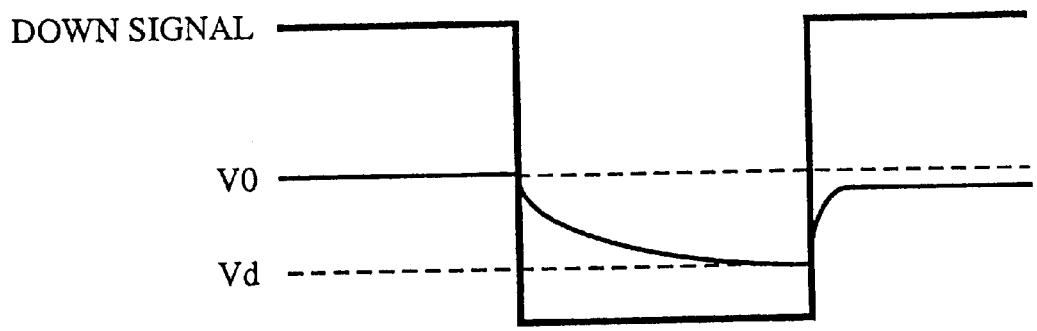
FIG. 10 is a diagram illustrating a waveform of the error signal Down output from phase comparator and that of the potential of the voltage signal passing through the lowpass filter.

FIG. 6 is a graph illustrating relationships between the LPF potential and the oscillation frequency of the voltage-controlled oscillator of the present embodiment 2 of the phase-locked loop circuit in accordance with the present invention. As illustrated in this figure, the upper limit value f1' and the lower limit value f2' of the oscillation frequency of the voltage-controlled oscillator 21, which is controlled in response to the voltage signal fed from the lowpass filter 3, is changed by the resistors connected by the switches 25a, 26a, 25b and 26b, whether they are the resistors 23a and 24a or the resistors 23b and 24b. Accordingly, by selecting the resistors 23a, 24a, 23b and 24b to be connected by turning on and off the switches 25a, 26a, 25b and 26b by means of the software control, the oscillation frequency of the voltage-controlled oscillator 21 can be limited to a desired range freely and automatically.

As described above, according to the present embodiment 2, by selecting some of the resistors 23a, 24a, 23b and 24b by turning on and off the switches 25a, 26a, 25b and 26b using software control, the resistance of the resistor to be connected in series with the N-channel transistor 15, and the resistance of the resistor to be connected in parallel with the series circuit can be set freely and automatically. As a result, the oscillation frequency of the voltage-controlled oscillator 21 determined by the voltage signal fed from the low pass filter 3 can be limited to a desired range freely and automatically. This offers an advantage of being able to increase the lock speed and stability of the phase-locked loop circuit simultaneously, accurately and efficiently.

Although either the resistors 23a and 24a or the resistors 23b and 24b are connected in parallel in the present embodiment 2, this is not essential. For example, three or more resistors with different resistances can be connected in parallel, or a plurality of resistors among them can be selected to be connected. This makes possible more fine adjustment of the resistance, which can limit the oscillation frequency of the voltage-controlled oscillator 21 more accurately.

What is claimed is:

1. A phase-locked loop circuit comprising:

a phase comparator for outputting an error signal corresponding to a phase difference between a reference signal and an output signal;

a charge pump for outputting a voltage signal corresponding to the error signal fed from said phase comparator;

a lowpass filter for passing a low frequency component of the voltage signal fed from said charge pump;

a voltage-controlled oscillator; and a controller including a series circuit having a first transistor, second transistor, a third resistor and a first resistor connected in series in this order, a second resistor connected in parallel with a series connection of said second transistor and said third resistor, and an operational amplifier having its non-inverting input terminal connected to an output terminal of said lowpass filter, its inverting input terminal connected to a connected point of said third resistor and said first resistor, and its output terminal connected to a gate of said second transistor.

2. The phase-locked loop circuit according to claim 1, wherein said voltage-controlled oscillator produces the output signal with an oscillation frequency corresponding to a voltage at a connecting point of said first transistor with said second transistor whose resistance is varied by an output of said lowpass filter.

3. The phase-locked loop circuit according to claim 2, wherein said second resistor and said third resistor each comprise a plurality of resistors with different resistances, and switches for selecting any of the plurality of resistors.

* * * * *